United States Patent
Chung et al.

(10) Patent No.: US 8,334,572 B2
(45) Date of Patent: Dec. 18, 2012

(54) RESISTIVE DEVICE FOR HIGH-K METAL GATE TECHNOLOGY

(75) Inventors: Sheng-Chen Chung, Jhubei (TW); Kong-Beng Thei, Hsinchu County (TW); Harry Chuang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/216,034

(22) Filed: Aug. 23, 2011

(65) Prior Publication Data

US 2011/0303982 A1 Dec. 15, 2011

Related U.S. Application Data

(62) Division of application No. 12/432,926, filed on Apr. 30, 2009, now abandoned.

(60) Provisional application No. 61/095,762, filed on Sep. 10, 2008.

(51) Int. Cl.
*H01L 23/62* (2006.01)

(52) U.S. Cl. .................. 257/363; 257/360; 257/516

(58) Field of Classification Search .............. 257/360, 257/516, 363
See application file for complete search history.

(56) References Cited

U.S. PATENT DOCUMENTS

| | | | |
|---|---|---|---|
| 5,442,223 A | 8/1995 | Fujii | |
| 6,406,956 B1 | 6/2002 | Tsai et al. | |
| 6,573,134 B2 | 6/2003 | Ma et al. | |
| 7,098,721 B2 | 8/2006 | Ouellette et al. | |
| 7,144,784 B2 | 12/2006 | Min et al. | |
| 7,659,168 B2 | 2/2010 | Hsu et al. | |
| 2005/0239273 A1* | 10/2005 | Yang | 438/601 |
| 2006/0234439 A1* | 10/2006 | Howard et al. | 438/238 |
| 2010/0019344 A1* | 1/2010 | Chuang et al. | 257/516 |
| 2012/0025323 A1* | 2/2012 | Teo et al. | 257/384 |

* cited by examiner

*Primary Examiner* — Phuc Dang
(74) *Attorney, Agent, or Firm* — Haynes and Boone, LLP

(57) ABSTRACT

A semiconductor device is provided which includes a semiconductor substrate, an isolation structure formed in the substrate for isolating an active region of the substrate, the isolation structure being formed of a first material, an active device formed in the active region of the substrate, the active device having a high-k dielectric and metal gate, and a passive device formed in the isolation structure, the passive device being formed of a second material different from the first material and having a predefined resistivity.

19 Claims, 14 Drawing Sheets

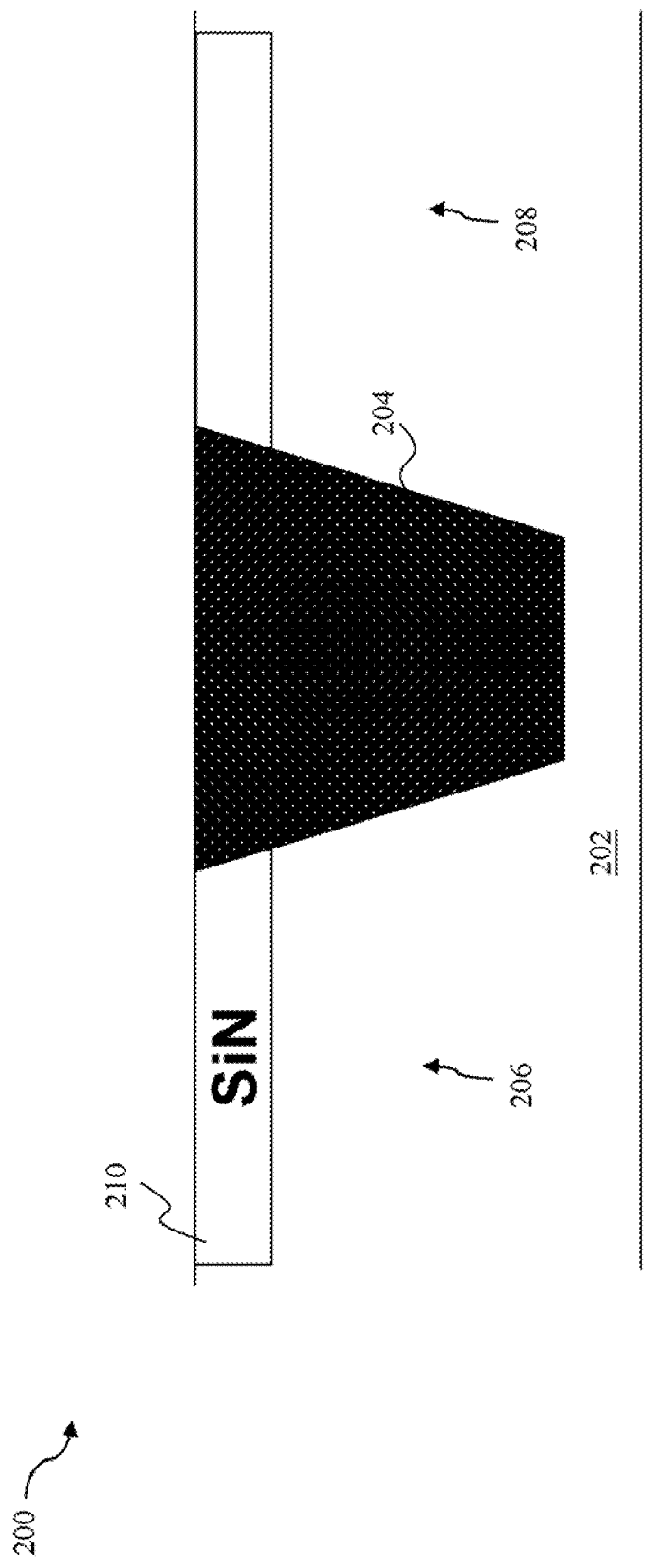

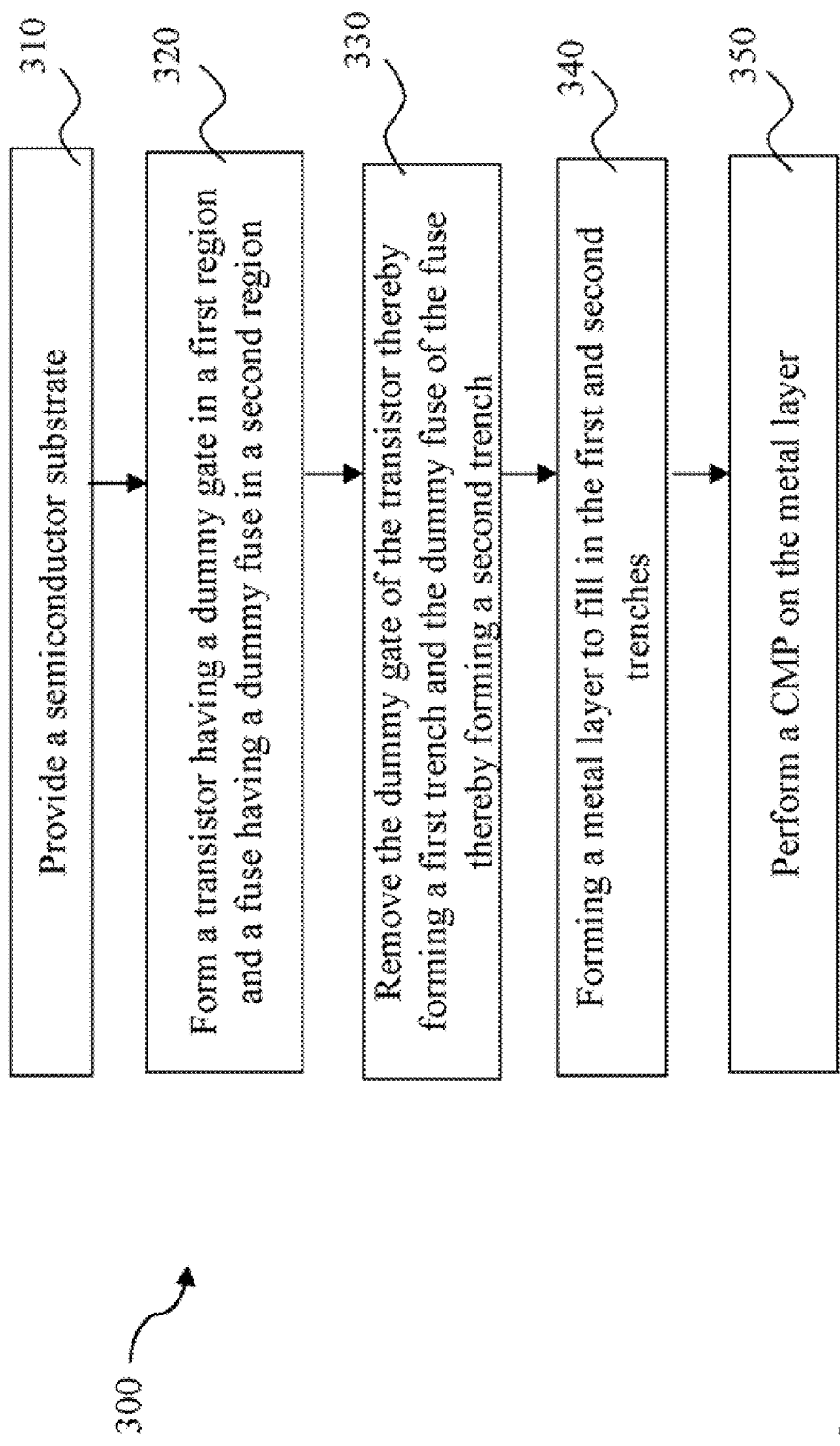

RESISTIVE DEVICE FOR HIGH-K METAL GATE TECHNOLOGY

PRIORITY DATA

This application is a divisional of U.S. Ser. No. 12/432,926 filed Apr. 30, 2009, and entitled, "Resistive Device for High-K Metal Gate Technology and Method of Making the Same," which claims priority to Provisional Application Ser. No. 61/095,762 filed on Sep. 10, 2008, entitled "Resistive Device For High-K Metal Gate Technology and Method of Making," the entire disclosure of which is incorporated herein by reference.

Furthermore, the present application is related to Ser. No. 13/216,114 filed Aug. 23, 2011, and entitled "Process to Make High-K Transistor Dielectrics," which is a Continuation of U.S. patent application Ser. No. 13/174,368, filed Jun. 30, 2011, which is a Continuation of U.S. patent application Ser. No. 12/201,602, filed on Aug. 29, 2008, issued as U.S. Pat. No. 7,977,754, which claims priority to Provisional Application Ser. No. 61/083,718, filed on Jul. 25, 2008, the entire disclosure of which is incorporated herein by reference.

FIELD OF THE INVENTION

The present disclosure relates generally to semiconductor technology, and more particularly, to resistive devices for high-k metal gate technology and method of making the same.

BACKGROUND

Polysilicon resistors have been widely used in conventional integrated circuit design, including for RC oscillators, current limitation resistance, ESD protect, RF post drivers, on-chip termination, impedance matching, etc. For replacement gate technology (also referred to as gate last process), the polysilicon resistor typically includes a silicide region, which exhibits lower than desirable resistivity, and accordingly requires higher than desirable area overhead. A single crystalline silicon resistor (e.g., a resistor formed in a semiconductor substrate) has been proposed to resolve this issue, however, the single crystalline silicon resistor fails to provide precise impedance matching and capacitance for analog circuits, such as radio frequency and mixed-mode circuits.

Polysilicon electronic fuses (eFuses) have been widely used in conventional memory integrated circuit design. For high-k metal gate technology, the eFuse exhibits lower than desirable resistivity due to a metal gate formed under and a silicide region formed over the polysilicon layer, and thus it may be difficult to burn-out the eFuse. Contact, via, and copper metal have been proposed to resolve this issue, however, such proposals fail to address programming voltage issues.

What is needed is a method to fabricate a resistor or eFuse device having desirable resistivity.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A to 2F are cross-sectional views of a semiconductor device at various stages of fabrication according to the method of FIG. 1;

FIG. 3 is a flowchart of a method for fabricating a semiconductor device having a metal gate eFuse disposed on an isolation structure according to various aspects of the present disclosure;

DETAILED DESCRIPTION

Figure 1:
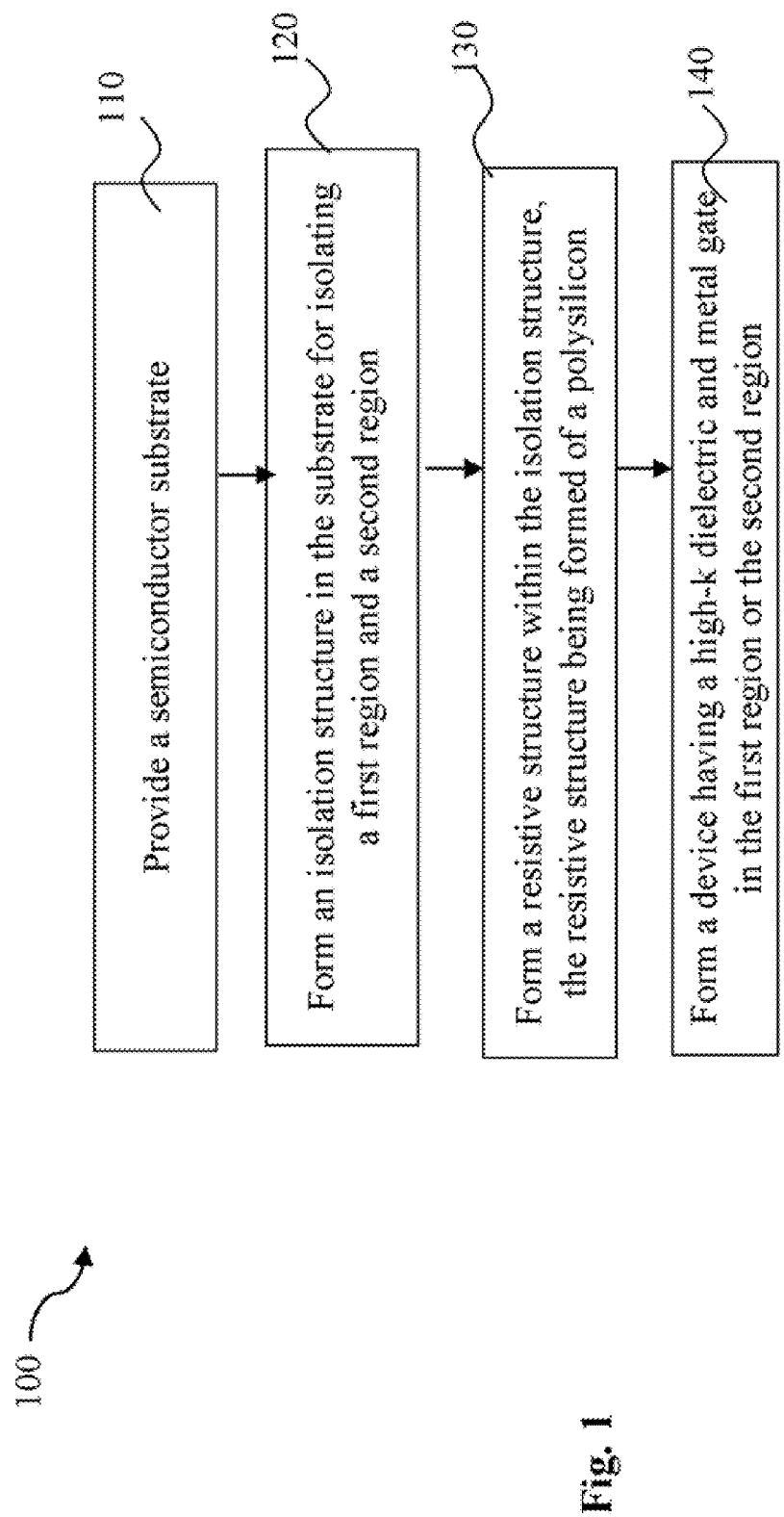
FIG. 1 is a flowchart of a method for fabricating a semiconductor device having a resistive structure disposed within an isolation structure according to various aspects of the present disclosure.

The present disclosure relates generally to the field of semiconductor integrated circuits. It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a flowchart of a method 100 for fabricating a semiconductor device according to various aspects of the present disclosure. Referring also to FIGS. 2A to 2F, illustrated are cross-sectional views of a semiconductor device 200 at various stages of fabrication according to the method 100 of FIG. 1. It should be noted that part of the method 100 may be implemented with a CMOS process flow. Accordingly, it is understood that additional processes may be provided before, during, and after the method 100, and that some other processes may only be briefly described herein. Further, FIGS. 2A to 2F may be simplified for a better understanding of the inventive concepts of the present disclosure.

The method 100 begins with block 110 in which a semiconductor substrate may be provided. In FIG. 2A, the substrate 202 may include a semiconductor wafer such as a silicon wafer. Alternatively, the substrate 202 may include other elementary semiconductors such as germanium. The substrate 202 may also include a compound semiconductor such as silicon carbide, gallium arsenic, indium arsenide, and indium phosphide. The substrate 202 may include an alloy semiconductor such as silicon germanium, silicon germanium carbide, gallium arsenic phosphide, and gallium indium phosphide. In one embodiment, the substrate 202 includes an epitaxial layer (epi layer) overlying a bulk semiconductor. Furthermore, the substrate 202 may include a semiconductor-on-insulator (SOI) structure. For example, the substrate 202 may include a buried oxide (BOX) layer formed by a process such as separation by implanted oxygen (SIMOX). In various embodiments, the substrate 202 may include a buried layer such as an N-type buried layer (NBL), a P-type buried layer (PBL), and/or a buried dielectric layer including a buried oxide (BOX) layer.

The method 100 continues with block 120 in which an isolation structure may be formed in the substrate for isolating a first region and second region of the substrate. The isolation structure 204 such as a shallow trench isolation (STI) or local oxidation of silicon (LOCOS) including the isolation feature may be formed in the substrate 202 to define and electrically isolate various active regions 206, 208. In furtherance of the embodiment, the isolation structure 204 may be formed by a series of processes such as growing a pad oxide, forming a low pressure chemical vapor deposition (LPCVD) nitride layer 210, patterning an opening using a photoresist and masking, etching a trench in the substrate 202, optionally growing a thermal oxide trench liner to improve the trench interface, filling the trench with CVD oxide, and performing a chemical mechanical polishing (CMP) to etch back and planarize the isolation structure 204.

Figure 2B:
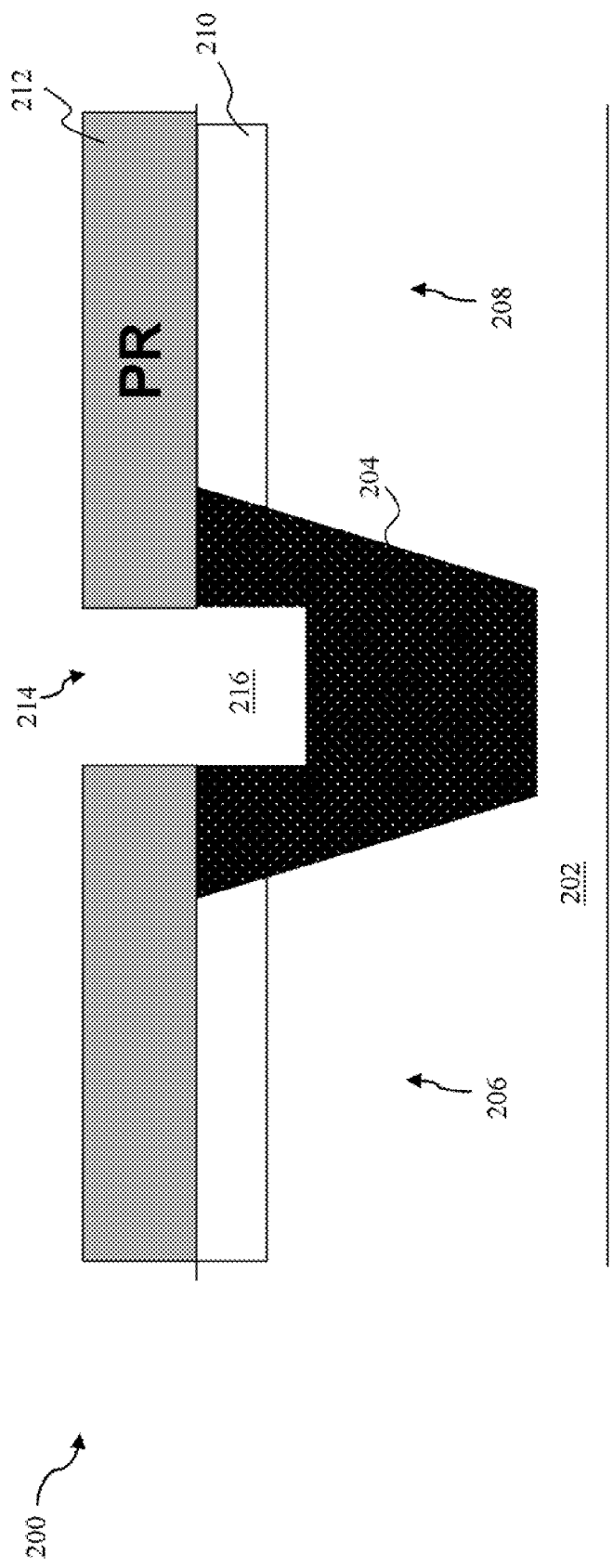

The method 100 continues with block 130 in which a resistive structure may be formed within the isolation structure. In FIG. 2B, a photoresist layer 212 may be formed over the substrate 202 and may be patterned with an opening 214 by a photolithography, immersion lithography, ion-beam writing, or other suitable technique. The opening 214 may include various shapes such as a line, rectangle, dog bone, polygon, or other suitable shape. A portion of the isolation structure 204 that is exposed by the opening 214 may be etched to form a trench 216 by a dry etch process, wet etch process, or a combination dry and wet etch process. The trench 216 may include a depth that is precisely controlled by the etch process to tune a resistance value for a resistor device. For example, the trench depth may be controlled by varying an oxide dip time for the etch process having a known etch rate.

Figure 2C:
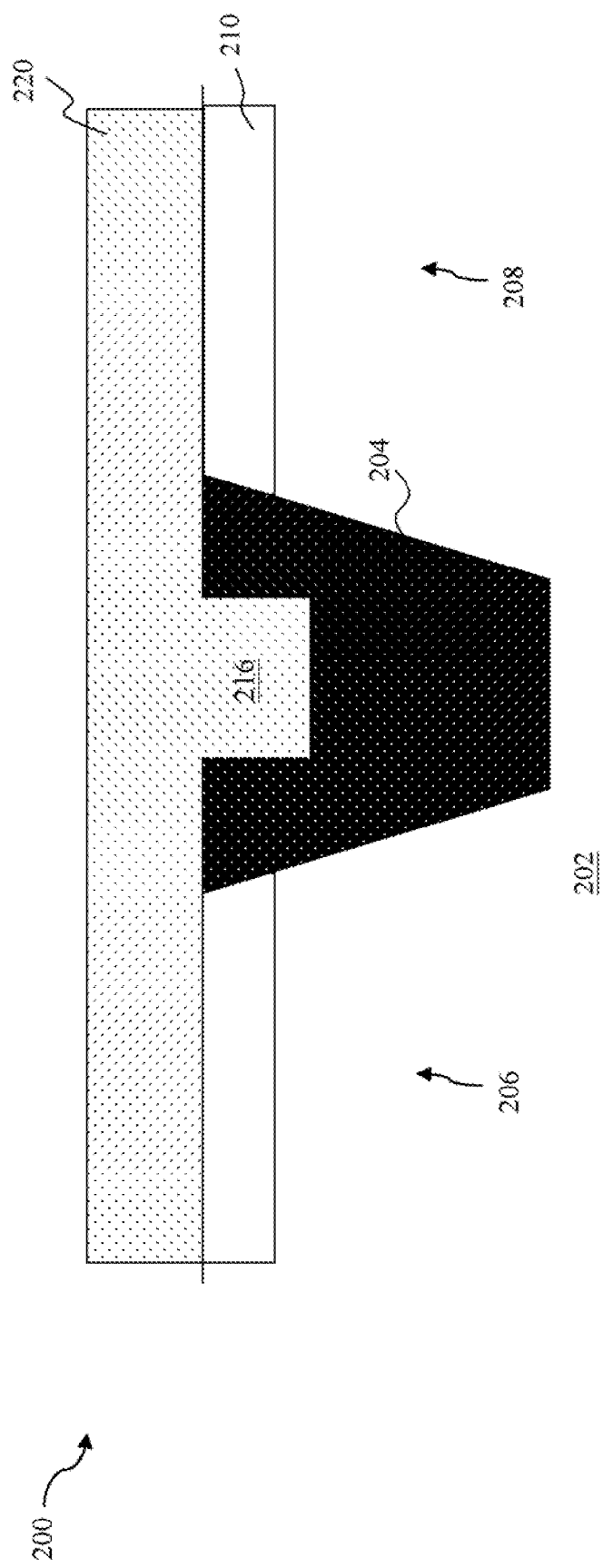
Figure 2D:
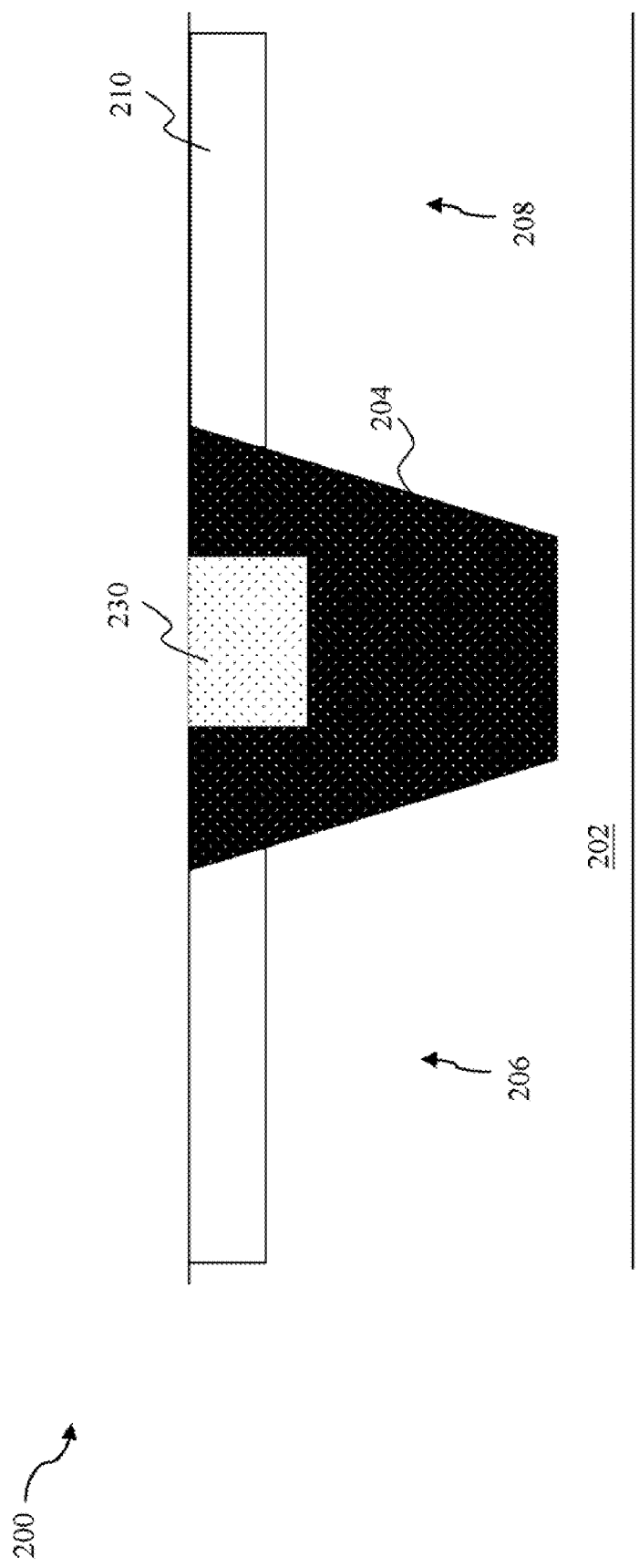
Figure 2E:
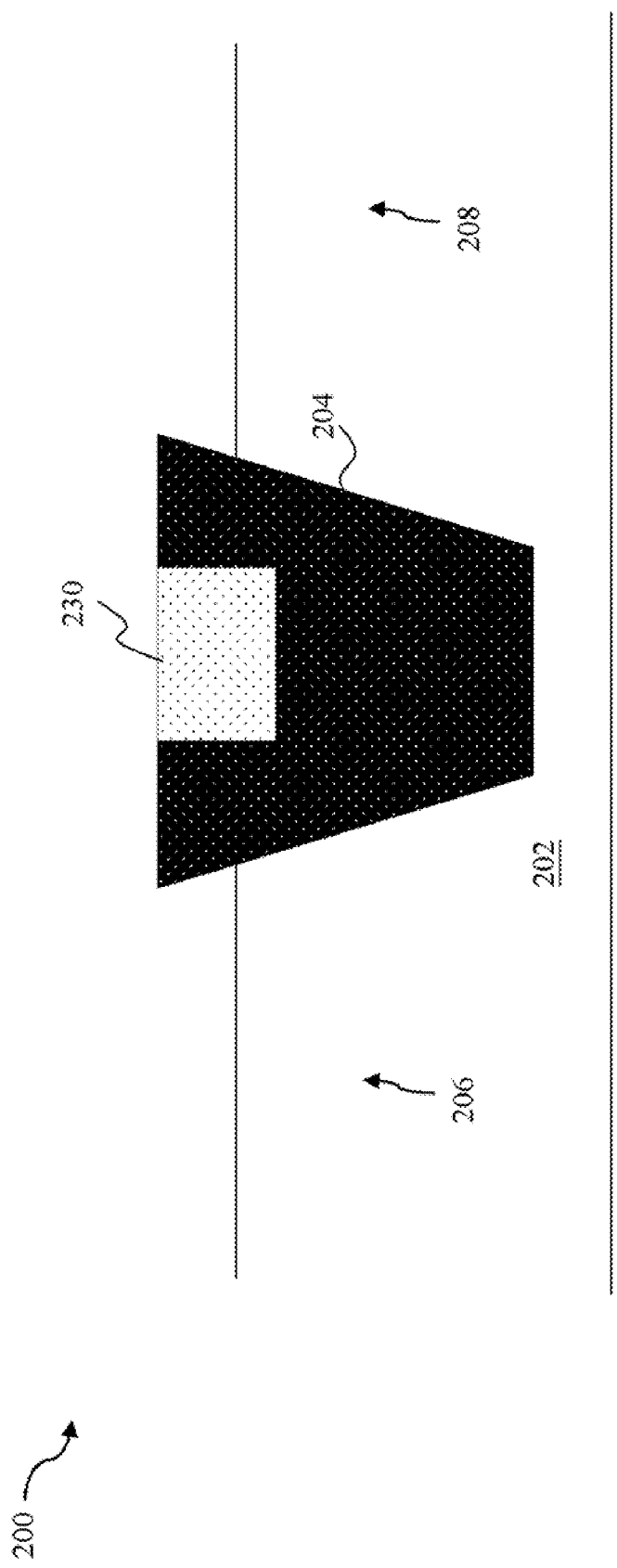

In FIG. 2C, a polysilicon layer 220 may be deposited over the nitride layer 210 and may fill in the trench 216 within the isolation structure 204. The polysilicon layer 220 may be deposited by CVD or other suitable deposition process. In FIG. 2D, a CMP process may be performed to etch back the polysilicon layer 220 and may stop at the nitride layer 210. Accordingly, a polysilicon resistor device 230 may be formed within the isolation structure 204. It should be noted that the polysilicon resistor device 230 may include a pure polysilicon which may be subsequently doped by a doping process (e.g., formation of lightly doped drain (LDD) regions or source/drain (S/D) regions discussed below). Alternatively, the polysilicon resistor device 230 may optionally be doped by depositing a doped polysilicon material in the trench 216 instead of depositing pure polysilicon subsequently doping the pure polysilicon. In FIG. 2E, the nitride layer 210 may be removed by a nitride stripping process as is known in the art.

Figure 2F:
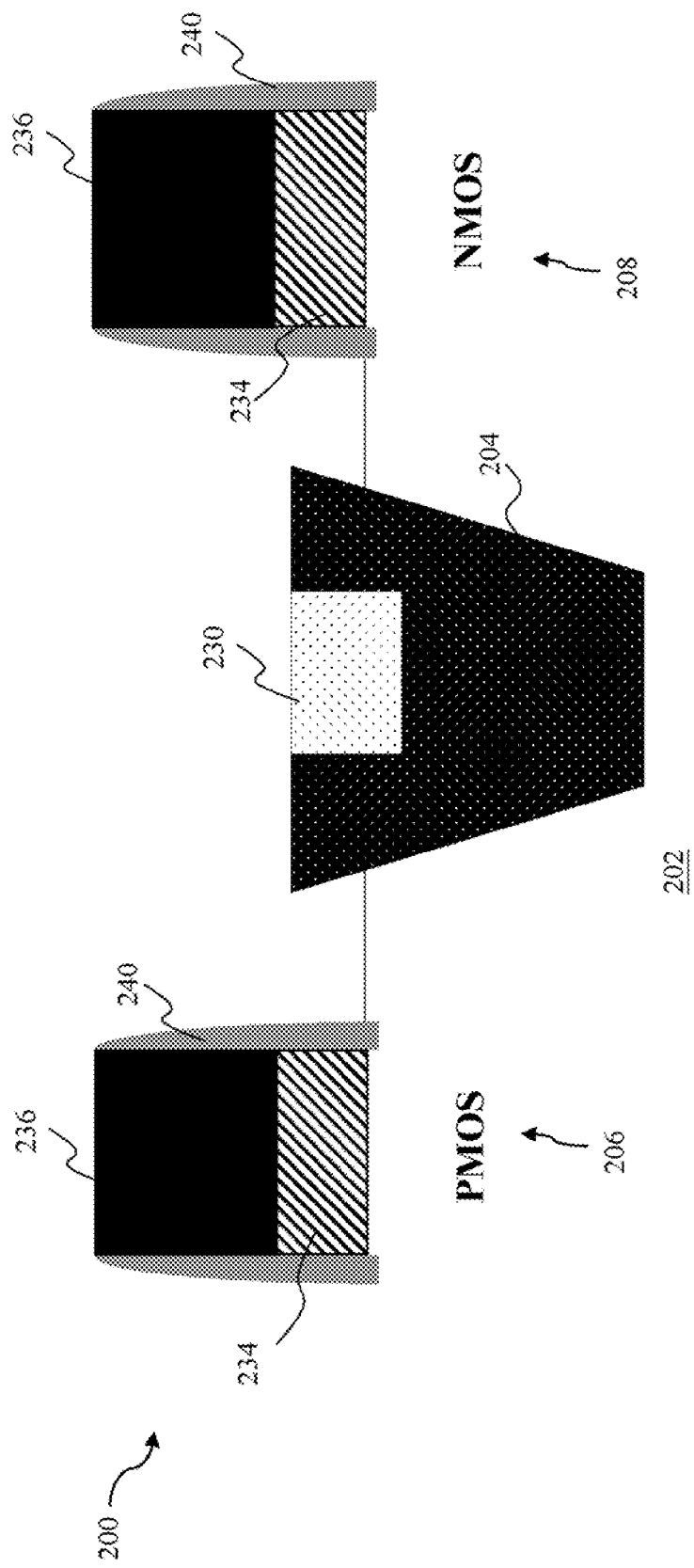

The method 100 continues with block 140 in which a device having a high-k dielectric and metal gate may be formed in the first region or second region. In FIG. 2F, a P-type metal-oxide-semiconductor (PMOS) device may be formed in the active region 206 and an N-type MOS (NMOS) device may be formed in the active region 208. The PMOS and NMOS devices may be formed by performing a CMOS process flow including a replacement poly gate process (or gate "last" process). In a gate last process, a dummy poly gate structure may be initially formed and the semiconductor device 200 may continue with the CMOS process flow to form various features (e.g., LDD regions, sidewall spacers, S/D regions, resist protective oxide (RPO), silicide features, contact etch stop layer (CESL), etc.) until deposition of an interlayer dielectric (ILD layer) by a high density plasma (HDP) deposition process or other suitable technique. A CMP process may be performed on the ILD layer to expose the dummy poly gate structure. The dummy poly gate may then be removed by an etch back or other suitable process thereby forming a trench. The trench may be filled with one or more metal layers, and a metal CMP process may then be performed to etch back and planarize the gate structure. Accordingly, the dummy poly gate structure may be replaced with a metal gate structure. Thereafter, the semiconductor device 200 may undergo further processing to form contacts/vias and interconnect features such as metal layers and interlayer dielectric to electrically couple the PMOS devices, NMOS devices, resistor devices, and other microelectronic devices (not shown) to form an integrated circuit. The various features of the semiconductor device 200 including the PMOS and NMOS devices are briefly discussed below.

For example, the gate structure may be formed on the substrate 202, including a gate dielectric 234 and metal gate 236. The gate dielectric 234 may include a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. Some examples may include hafnium oxide ($HfO_2$) hafnium silicon oxide (HfSiO), hafnium silicon oxynitride (HfSiON), hafnium tantalum oxide (HfTaO), hafnium titanium oxide (HfTiO), hafnium zirconium oxide (HfZrO), and combinations thereof. The gate dielectric 234 may have a multilayer structure such as one layer of silicon oxide (e.g., interfacial layer) and another layer of high-k material. The gate dielectric 234 layer may have a thickness ranging from about 10 to about 30 angstroms (A). The gate dielectric may be formed using chemical vapor deposition (CVD), physical vapor deposition (PVD), atomic layer deposition (ALD), thermal oxide, other suitable processes, or combinations thereof.

The metal gate 236 may be configured to be coupled to metal interconnects and may be disposed overlying the gate dielectric 234. The metal gate 236 may include TiN, TaN, TaC, CoSi, $ZrSi_2$, $MoSi_2$, $TaSi_2$, $NiSi_2$, WN, TiAl, TiNAl, Al, other suitable conductive materials, or combinations thereof. The metal gate 236 may be formed by CVD, PVD, plating, or other suitable processes, and may be followed by a metal CMP process to planarize the gate structure. The metal gate 236 may have a multilayer structure and may be formed in a multiple-step process. In some other embodiments, a capping layer such as lanthanum oxide or aluminum oxide may be formed on the high-k dielectric or under the high-k dielectric for tuning an effective work function of the metal gate for properly performing as a PMOS or NMOS device.

The gate structure may be formed using a process including photolithography patterning and etching. One exemplary method for patterning the gate dielectric and dummy poly gate structure is described below. A layer of photoresist is formed on the polysilicon layer by a suitable process, such as spin-on coating, and then patterned to form a patterned photoresist feature by a proper lithography patterning method. The pattern of the photoresist can then be transferred by a dry etching process to the underlying polysilicon layer and the gate dielectric in a plurality of processing steps and various proper sequences. The photoresist layer may be stripped thereafter. In another embodiment, a hard mask layer may be used and formed on the polysilicon layer. The patterned photoresist layer is formed on the hard mask layer. The pattern of the photoresist layer is transferred to the hard mask layer and then transferred to the polysilicon layer to form the dummy poly gate. The hard mask layer may include silicon nitride, silicon oxynitride, silicon carbide, and/or other suitable dielectric materials, and may be formed using a method such as CVD or PVD.

Lightly doped source/drain regions (also referred to as LDD regions) may be formed in the semiconductor substrate 202 after the gate patterning or etching process discussed above. The LDD regions may be a doped P-type (e.g., boron or $BF_2$) and/or doped N-type (e.g., phosphorous or arsenic) by an ion implantation process and may include various doping profiles for the PMOS device 206 and NMOS device 208 as is known in the art. As previously noted, the polysilicon resistor device 230 may be doped during this process.

Sidewall spacers 240 may be formed on both sidewalls of the gate structure. The sidewall spacers 240 may include a dielectric material such as silicon oxide. Alternatively, the sidewall spacers 240 may optionally include silicon nitride, silicon carbide, silicon oxynitride, or combinations thereof. In some embodiments, the sidewall spacers 240 may have a multilayer structure. The sidewall spacers 240 may be formed by a deposition and etching (anisotropic etching technique) as is known in the art.

Source/drain (S/D) regions of a P-type may be formed in the PMOS device 206 and S/D regions of an N-type may be formed in the NMOS device 208. The S/D regions may be positioned on both sides of the gate structure and interposed thereby. The S/D regions may be formed directly on the semiconductor substrate 202, in a P-well structure, in a N-well structure, in a dual-well structure, or using a raised structure. The S/D regions may comprise various doping profiles and may be formed by a plurality of ion implantation processes. A rapid thermal process (RTP) may be performed to activate the doped regions. As previously noted, the polysilicon resistor device 230 may optionally be doped during this process.

In some embodiments, a resist protective oxide (RPO) may be formed over some or all of the polysilicon resistor device 230 and may function as a silicide blocking layer during a subsequent salicidation process. Accordingly, the polysilicon resistor device 230 may not include a silicide region that exhibits lower than desirable resistance. The semiconductor device 200 may further include forming various contacts and metal features on the substrate 202. Silicide features may be formed by silicidation such as self-aligned silicide (salicide) in which a metal material is formed next to a Si structure, then the temperature is raised to anneal and cause a reaction between underlying silicon and the metal to form a silicide, and the un-reacted metal is etched away. The salicide material may be self-aligned to be formed on various features such as the S/D regions or other doped regions to reduce contact resistance.

Also, a plurality of patterned dielectric layers and conductive layers are formed on the substrate 202 to form multilayer interconnects configured to couple the PMOS and NMOS devices (e.g., P-type and N-type doped regions, such as the S/D regions, contact region, the metal gate), the polysilicon resistor devices, and other microelectronic devices (not shown) of an integrated circuit. In one embodiment, an interlayer dielectric (ILD) and a multilayer interconnect (MLI) structure are formed. In furtherance of the example, the MIL structure includes contacts, vias and metal lines formed on the substrate. In one example, the MIL structure may include conductive materials such as aluminum, aluminum/silicon/copper alloy, titanium, titanium nitride, tungsten, polysilicon, metal silicide, or combinations thereof, being referred to as aluminum interconnects.

Aluminum interconnects may be formed by a process including physical vapor deposition (or sputtering), CVD, or combinations thereof. Other manufacturing techniques to form the aluminum interconnect may include photolithography processing and etching to pattern the conductive materials for vertical connection (via and contact) and horizontal connection (conductive line). Alternatively, a copper multilayer interconnect may be used to form the metal patterns. The copper interconnect structure may include copper, copper alloy, titanium, titanium nitride, tantalum, tantalum nitride, tungsten, polysilicon, metal silicide, or combinations thereof. The copper interconnect may be formed by a technique including CVD, sputtering, plating, or other suitable processes.

The ILD material includes silicon oxide. Alternatively or additionally, the ILD includes a material having a low dielectric constant. In one embodiment, the dielectric layer includes silicon dioxide, silicon nitride, silicon oxynitride, polyimide, spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. The dielectric layer may be formed by a technique including spin-on, CVD, or other suitable processes.

MLI and ILD structures may be formed in an integrated process such as a damascene process. In a damascene process, a metal such as copper is used as conductive material for interconnection. Another metal or metal alloy may be additionally or alternatively used for various conductive features. Accordingly, silicon oxide, fluorinated silica glass, or low dielectric constant (k) materials can be used for ILD. During the damascene process, a trench is formed in a dielectric layer, and copper is filled in the trench. A chemical mechanical polishing (CMP) technique is implemented afterward to etch back and planarize the substrate surface.

Referring to FIG. 3, illustrated is a flowchart of a method 300 for fabricating a semiconductor device having a metal gate eFuse according to various aspects of the present disclosure. Referring also to FIGS. 4A to 4E, illustrated are cross-sectional views of a semiconductor device 400 at various stages of fabrication according to the method 300 of FIG. 3. The semiconductor device 400 may be fabricated in a gate "last" process and may be integrated with the fabrication of the semiconductor device 200 of FIG. 2. Accordingly, similar features in FIGS. 2 and 4 are number the same for the sake of simplicity and clarity. Moreover, the semiconductor device 400 may be fabricated with the same processes discussed above for fabricating the semiconductor device 200.

Figure 4A:
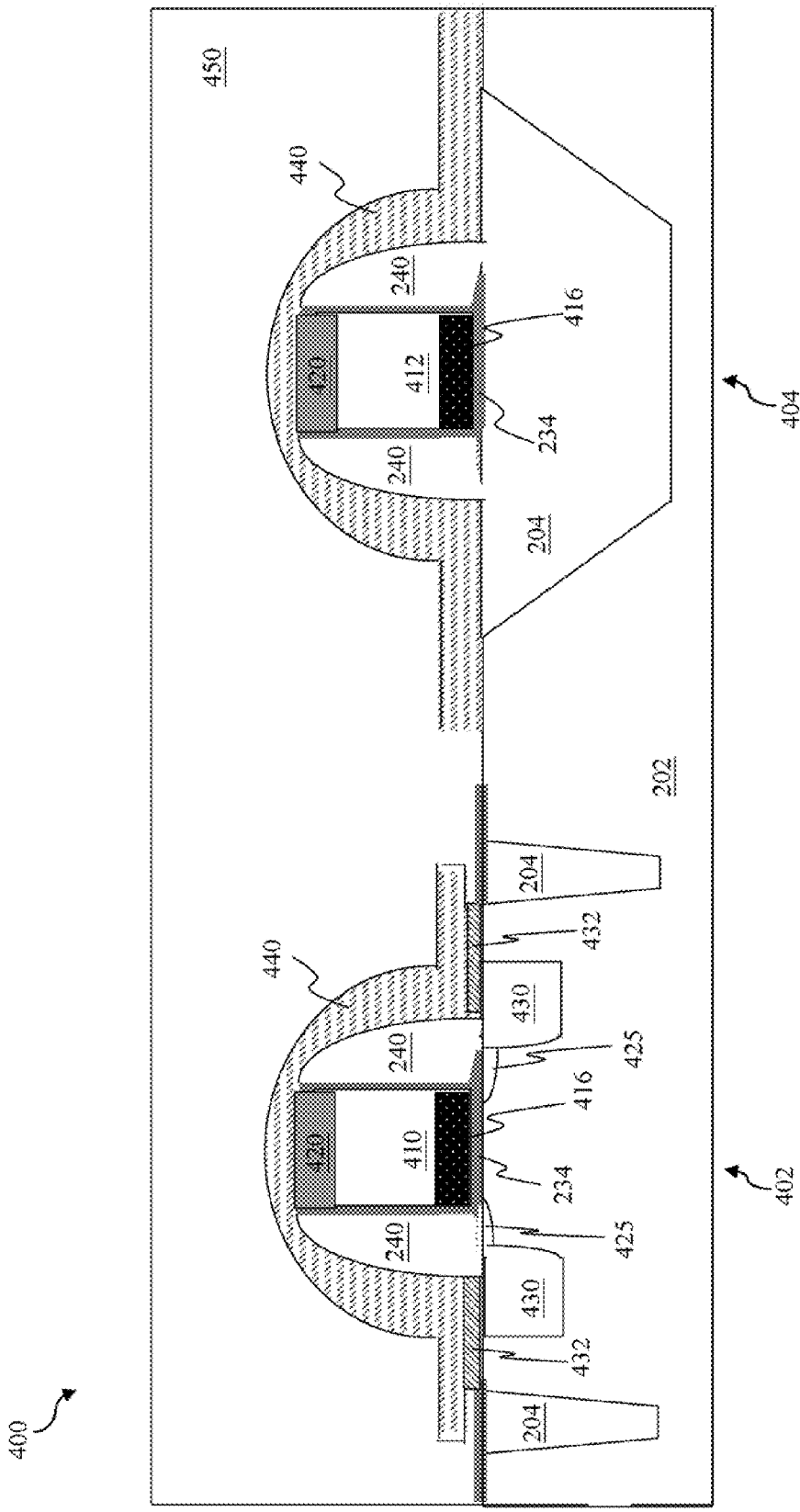
FIGS. 4A to 4E are cross-sectional views of a semiconductor device at various stages of fabrication according to the method of FIG. 3.

The method 300 begins with block 310 in which a semiconductor substrate may be provided. In FIG. 4A, the semiconductor device 400 may include a semiconductor substrate 202. A plurality of isolation structures such as STI 204 may be formed in the substrate 202 for isolation one or more devices. For example, the STI 204 may be used to isolate a MOS device 402 (similar to the PMOS device 206 and NMOS device 208 of FIG. 2). Additionally, an eFuse device 404 may be formed on the STI 204.

The method 300 continues with block 320 in which a transistor having a dummy gate may be formed in a first region and a fuse having a dummy fuse may be formed in a second region. The MOS device 402 and eFuse 404 may be formed in a gate "last" process in which a dummy poly gate 410 may be formed for the MOS device 402 and a dummy fuse 412 may be formed for the eFuse device 404. The dummy poly gate 410 and dummy fuse 412 may be formed by depositing various materials layers and patterning the various layers to form a gate structure for the MOS 402 device and a fuse structure for the eFuse device 404.

For example, a gate dielectric layer 234 may be formed over the substrate 202. The gate dielectric layer 234 may include an interfacial oxide layer and high-k dielectric layer. The gate dielectric 234 layer may have a thickness ranging from about 10 to about 30 angstroms (A). The semiconductor device 400 may further include a capping layer such as lanthanum oxide or aluminum oxide for tuning a work function of a metal layer for properly performing as an NMOS or PMOS device. A metal barrier layer 416 may be formed over the gate dielectric layer 234. The metal barrier layer 416 may function as a barrier and prevent Fermi level pinning between the high-k dielectric layer and a subsequently deposited polysilicon layer. For example, the metal barrier layer 416 may include TiN having a thickness ranging from about 10 to about 200 angstrom (A). The metal barrier layer 416 may be formed by various deposition techniques such as chemical vapor deposition (CVD), physical vapor deposition (PVD or sputtering), plating, or other suitable technique. A polysilicon layer may be formed on the metal barrier layer 416 by CVD or other suitable technique. The polysilicon layer may include a thickness ranging from about 400 to about 800 angstrom (A). The polysilicon layer may be patterned to form the dummy poly gate 410 of the MOS device 402 and the dummy fuse 412 of the eFuse device 404.

The gate structure of the MOS device 402 and the fuse structure of the eFuse device 404 may be formed by a process including photolithography patterning and etching. One exemplary method for patterning the gate structure and fuse structure is described below. A hard mask layer 420 may be used and formed on the polysilicon layer. A patterned photoresist layer is formed on the hard mask layer. The pattern of the photoresist layer is transferred to the hard mask layer and then transferred to the polysilicon layer to form the dummy poly gate 410 and dummy fuse 412. The hard mask layer 420 may include silicon nitride, silicon oxynitride, silicon carbide, and/or other suitable dielectric materials, and may be formed using a method such as CVD or PVD.

Thereafter, the semiconductor device 400 may undergo CMOS process flow to form various features such as lightly doped drain (LDD) regions 425, sidewall spacers 240, source/drain regions 430 and silicide regions 432. A stressed layer may be formed over the MOS device 402 and eFuse device 404. For example, a contact etch stop layer (CESL) 440 may be formed and may include silicon nitride, silicon oxynitride, and/or other suitable materials. A dielectric layer such as an inter-layer (or level) dielectric (ILD) layer 450 may be formed over the CESL 440 by CVD, high density plasma CVD (HDP-CVD), spin-on, PVD (or sputtering), or other suitable methods. The ILD layer 450 may include silicon oxide or a low k material.

Figure 4B:
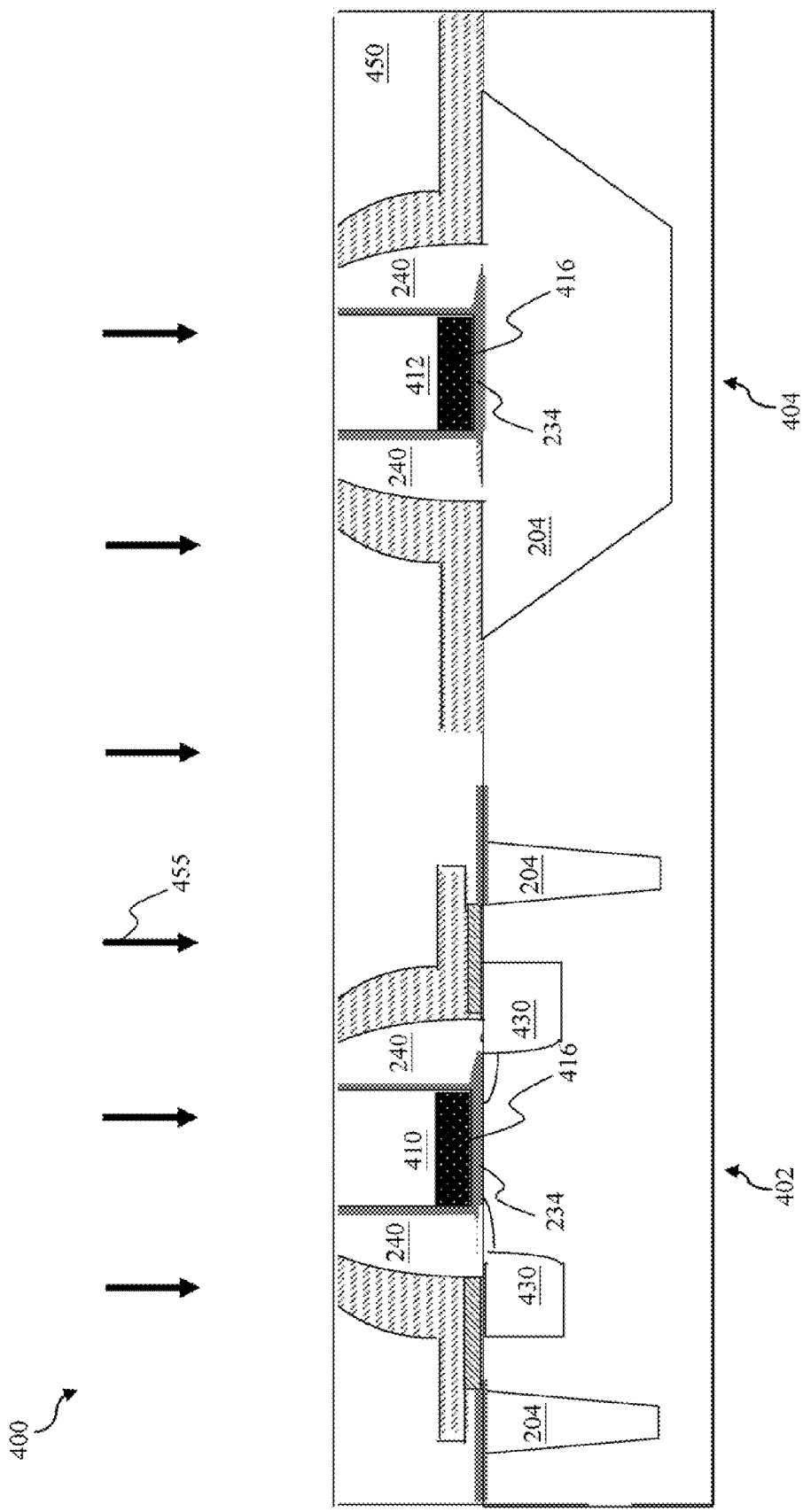
Figure 4C:
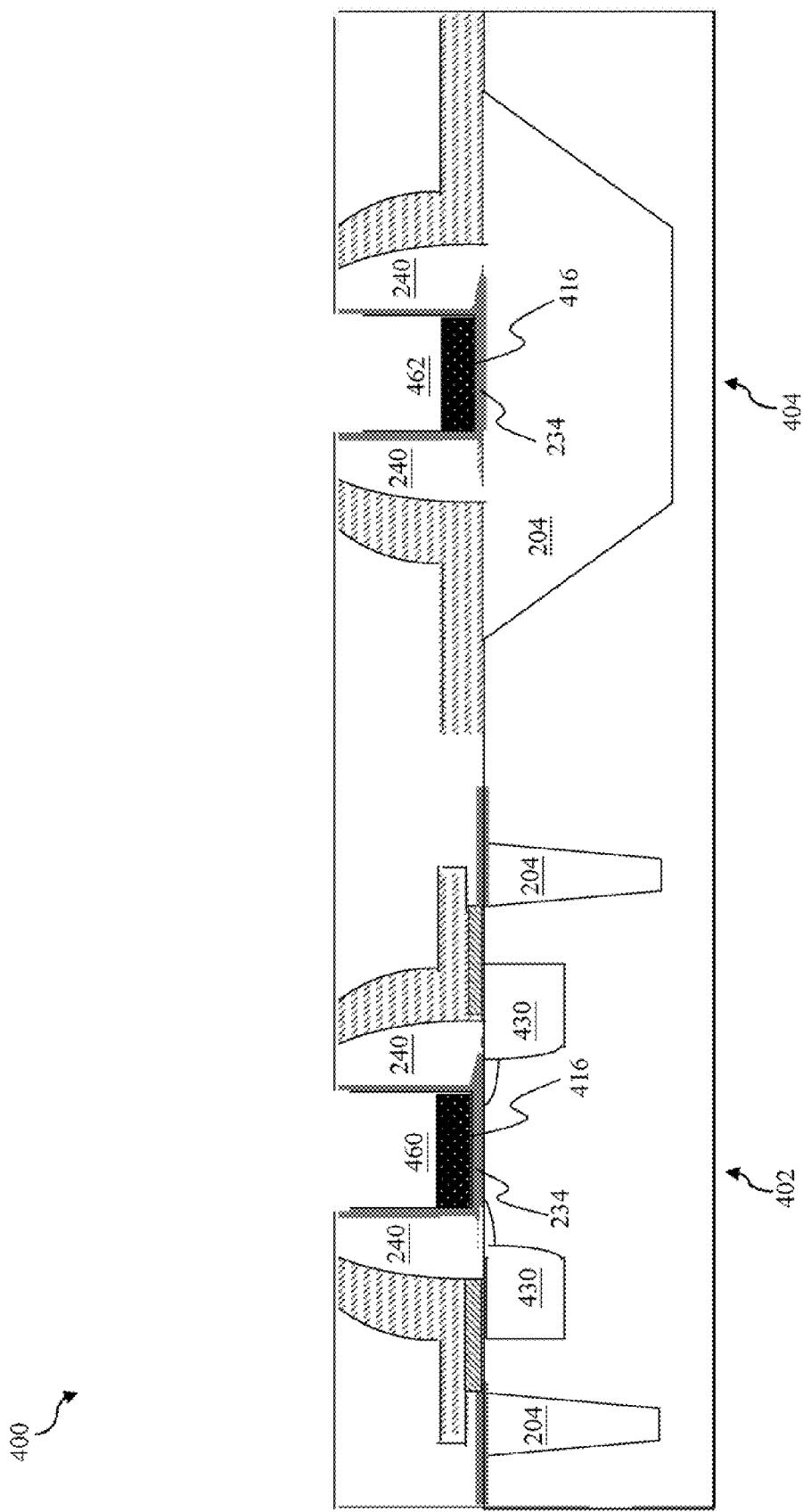

The method 300 continues with block 330 in which the dummy gate of the transistor may be removed thereby forming a first trench and the dummy fuse of the fuse may be removed thereby forming a second trench. In FIG. 4B, a CMP process 455 may be performed on the ILD layer 450 to expose the dummy poly gate 410 and the dummy fuse 412. The CMP process 455 may stop at the hard mask layer 420 and continue with an over-polishing to remove the hard mask layer 420. In FIG. 4C, an etch back process, dry etch, wet etch, or other suitable process may then be performed to remove the dummy poly gate 410 and the dummy fuse 412. For example, a wet etch process may include exposure to a hydroxide containing solution (e.g., ammonium hydroxide), de-ionized water, and/or other suitable etchant solutions. Accordingly, a trench 460 may be formed in the gate structure and a trench 462 may be formed in the fuse structure. It should also be noted that during the poly etching process, the risk of damaging the high-k dielectric may be reduced since the metal barrier layer 416 functions as an etch barrier.

Figure 4D:
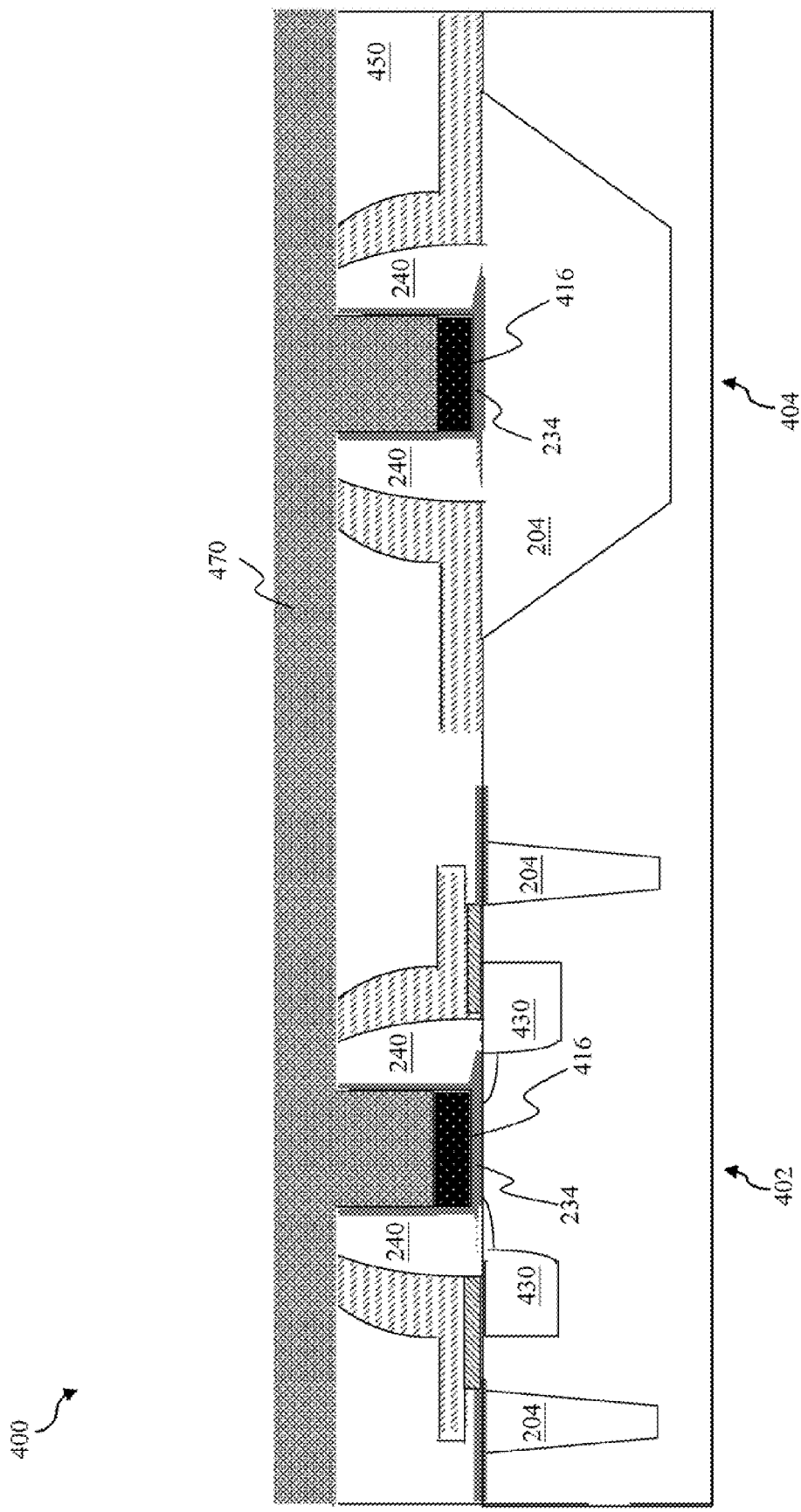

The method 300 continues with block 340 in which a metal may be formed to fill in the first and second trenches. In FIG. 4D, one or more metal layers may be deposited to form a metal gate of the MOS device 402 and a metal fuse of the eFuse device 404. The metal layer 470 may include any metal material suitable for forming a metal gate or portion thereof, including work function metal layers, fill metal layers, liner layers, interface layers, seed layers, etc. For example, the metal layer 470 may include a work function metal layer (e.g., N-type or P-type work function metal) and a fill metal layer. The work function metal layer may include TiN, TiAlN, TaN, TaSiN, WN, TaC, TaCN, or combinations thereof. The fill metal layer may include Al, Cu, W, or other suitable material. The metal layer 470 may be formed by PVD, CVD, plating, or other suitable technique.

Figure 4E:
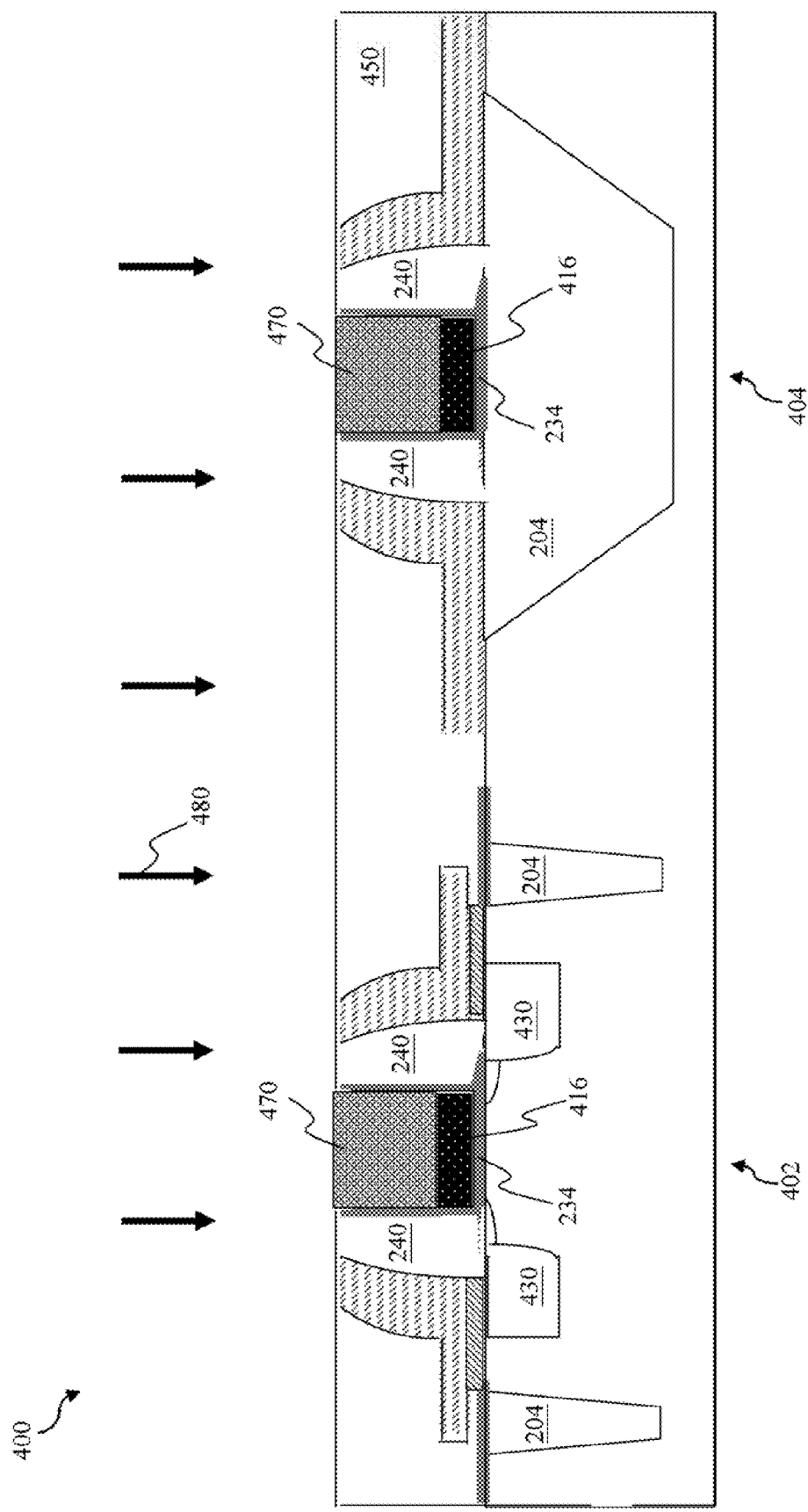

The method 300 continues with block 350 in which a CMP process may be performed. In FIG. 4E, a CMP process 480 may be performed on the metal layer 470 to planarize the gate structure of the MOS device 402 and the fuse structure of the eFuse device 404. Accordingly, the eFuse device 404 may include a gate dielectric layer 234, metal barrier layer 416, and metal gate layer 470. The metal gate layer 470 may include a thickness of about 800 angstrom following the CMP process 480. Thus, the MOS device 402 and eFuse device 404 may be formed in the same process without additional masking layers. It is understood that the semiconductor device 400 may undergo further processing to form various features such as contacts/vias, interconnect metal layers, interlayer dielectric, passivation layers, etc. as discussed above.

Figure 5:
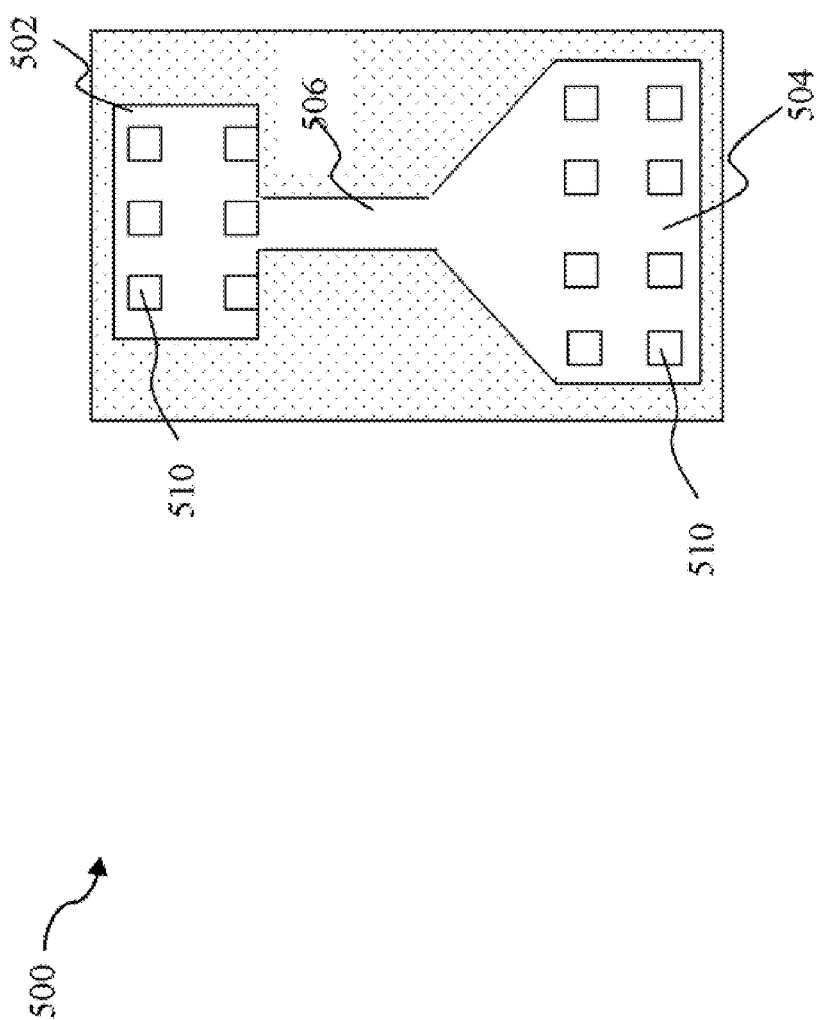
FIG. 5 is a top view of an eFuse structure that may be implemented in the semiconductor device of FIG. 4.

Referring to FIG. 5, illustrated is a top view of an eFuse device 500 that may be implemented in the semiconductor device 400 of FIG. 4. The eFuse device 500 may include an anode portion 502, a cathode portion 504, and a link portion 506. A plurality of contacts 510 may be coupled to the anode portion 502 and cathode portion 504 to electrically connect the eFuse device 500 to an interconnect structure of the semiconductor device. A programming voltage may be applied across the anode 502 and cathode 504 via the contacts 510 to "burn-out" the eFuse device 500. That is, the link portion 506 of the eFuse 500 may be burned-out and form an open circuit condition. It has been observed that an all metal fuse structure may improve the programming voltage in high-k metal gate technology as compared to a metal/polysilicon/silicide fuse structure.

The disclosed structure and method may have various embodiments, modifications and variations. In one example, the semiconductor device may further include a stress layer overlying the substrate and gate structures. The stress layer may comprise silicon nitride, silicon oxynitride, silicon oxide, and silicon carbide. In another embodiment, the source and drain regions may have different structures, such as raised, recessed, or strained. Further embodiments may also include, but are not limited to, vertical diffused metal-oxide-semiconductor (VDMOS), other types of high power MOS transistors, Fin structure field effect transistors (FinFET), and strained MOS structures. In still other embodiments, the resistive structure formed in the isolation structure may include a polysilicon eFuse or other passive device.

The present invention achieves different advantages in various embodiments disclosed herein. For example, the present disclosed method provides a simple and cost-effective method for incorporating a polysilicon resistor device and a metal eFuse device in high-k dielectric metal gate technology. Additionally, the methods and devices disclosed herein may easily be integrated with current CMOS technology processing and semiconductor processing equipment. Further, the methods and devices disclosed herein provide a easy way to control the resistance value of the polysilicon resistor device and avoid silicidation of the polysilicon resistor device during processing. Moreover, the methods and devices disclosed herein provide a way to improve the programming voltage of the eFuse for advance technology process nodes (e.g., 45 nm and beyond). It is understood that different embodiments disclosed herein offer different advantages, and that no particular advantage is necessarily required for all embodiments.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, although the semiconductor device is described in a gate "last" process, the PMOS and NMOS devices may be also fabricated in a gate first process (without dummy poly gate structures), or a hybrid process that includes a gate first process to form one type of metal gate and a gate last process to form the other type of metal gate.

What is claimed is:

1. A semiconductor device comprising:
a semiconductor substrate;
a first isolation structure in the substrate for isolating an active region of the substrate;
a transistor formed in the active region, the transistor having a gate structure that includes a high-k dielectric layer and a metal layer; and
a fuse structure formed on the isolation structure, the fuse structure having a link portion that includes the high-k dielectric layer and the metal layer, wherein the link portion does not include a polysilicon layer disposed on the metal layer, further wherein the metal layer of the transistor is co-planar with the metal layer of the fuse structure.

2. The semiconductor device of claim 1, wherein the transistor include a PMOS device or an NMOS device.

3. The semiconductor device of claim 1, wherein the isolation structure includes a shallow trench isolation (STI) structure.

4. The semiconductor device of claim 1, wherein the metal gate includes TiN, TaN, TaC, WN, TiAl, TiNAl, Al, or combinations thereof.

5. The semiconductor device of claim 1, wherein the gate structure of the transistor does not include the polysilicon layer disposed on the metal layer.

6. The semiconductor device of claim 1, wherein the fuse structure includes an eFuse device.

7. The semiconductor device of claim 1, further including a second isolation structure formed in the substrate; and
a polysilicon resistor disposed within the second isolation structure such that a top surface of the polysilicon resistor is co-planar with a top surface of the second isolation structure.

8. The semiconductor device of claim 1, wherein the active device include a PMOS device or an NMOS device.

9. The semiconductor device of claim 1, wherein the isolation structure includes a shallow trench isolation (STI) structure.

10. The semiconductor device of claim 1, wherein the metal gate includes TiN, TaN, TaC, WN, TiAl, TiNAl, Al, or combinations thereof.

11. The semiconductor device of claim 1, wherein the gate structure of the active device does not include the polysilicon layer disposed on the metal layer.

12. The semiconductor device of claim 1, wherein the fuse structure includes an eFuse device.

13. The semiconductor device of claim 1, wherein the metal layer of the active device is co-planar with the metal layer of the fuse structure.

14. The semiconductor device of claim 1, further including a second isolation structure formed in the substrate; and
a polysilicon resistor disposed within the second isolation structure such that a top surface of the polysilicon resistor is co-planar with a top surface of the second isolation structure.

15. The semiconductor device of claim 1, wherein the metal gate includes TiN, TaN, TaC, WN, TiAl, TiNAl, Al, or combinations thereof.

16. The semiconductor device of claim 1, wherein the gate structure of the active device does not include the polysilicon layer disposed on the metal layer.

17. The semiconductor device of claim 1, wherein the metal layer of the active device is co-planar with the metal layer of the eFuse structure.

18. A semiconductor device comprising:
a semiconductor substrate;
a first isolation structure in the substrate for isolating an active region of the substrate;
an active device formed in the active region, the active device having a gate structure that includes a high-k dielectric layer and a metal layer; and
a fuse structure formed on the isolation structure, the fuse structure having a link portion that includes the high-k dielectric layer and the metal layer, wherein the link portion does not include a polysilicon layer disposed on the metal layer.

19. A semiconductor device comprising:
an active device formed in an active region of a semiconductor substrate, the active device having a gate structure that includes a high-k dielectric layer and a metal layer;
an isolation structure in the substrate adjacent the active region; and
an eFuse structure formed over the isolation structure, the eFuse structure having a link portion that includes the high-k dielectric layer and the metal layer, wherein the link portion does not include a polysilicon layer disposed on the metal layer.

* * * * *